United States Patent [19]

O'Neill

[11] Patent Number: 4,957,592
[45] Date of Patent: Sep. 18, 1990

[54] METHOD OF USING ERODABLE MASKS TO PRODUCE PARTIALLY ETCHED STRUCTURES IN ODE WAFER STRUCTURES

[75] Inventor: James F. O'Neill, Penfield, N.Y.

[73] Assignee: Xerox Corporation, Rochester, N.Y.

[21] Appl. No.: 458,182

[22] Filed: Dec. 27, 1989

[51] Int. Cl.⁵ .................. H01L 21/306; B44C 1/22; C03C 15/00; C03C 25/06
[52] U.S. Cl. ................... 156/644; 156/647; 156/657; 156/661.1; 156/662
[58] Field of Search ............. 156/644, 647, 653, 657, 156/659.1, 661.1, 662; 346/1.1, 140 R, 140 A; 430/312, 313

[56] References Cited

U.S. PATENT DOCUMENTS

| | | |
|---|---|---|
| Re. 32,572 | 1/1988 | Hawkins et al. .................. 156/626 |
| 4,455,192 | 6/1984 | Tamai .............................. 156/647 X |
| 4,683,646 | 8/1987 | Kando et al. ......................... 29/611 |
| 4,810,557 | 3/1989 | Blonder ......................... 156/661.1 X |
| 4,863,560 | 9/1989 | Hawkins ............................. 156/644 |
| 4,875,968 | 10/1989 | O'Neill et al. .................. 156/647 X |
| 4,899,178 | 2/1990 | Tellier ............................. 346/140 R |

Primary Examiner—William A. Powell
Attorney, Agent, or Firm—Oliff & Berridge

[57] ABSTRACT

The thermal ink jet silicon wafer printhead is formed in a single etching operation by partially etching into one portion of the wafer while at the same time completely etching through another portion of the wafer. An erodable mask layer is used to delay etching of partially etched regions in the wafer, the depth of the etching being defined by the etch time after the removal of the erodable masking layer, or by the V-groove termination as determined by via opening.

20 Claims, 4 Drawing Sheets

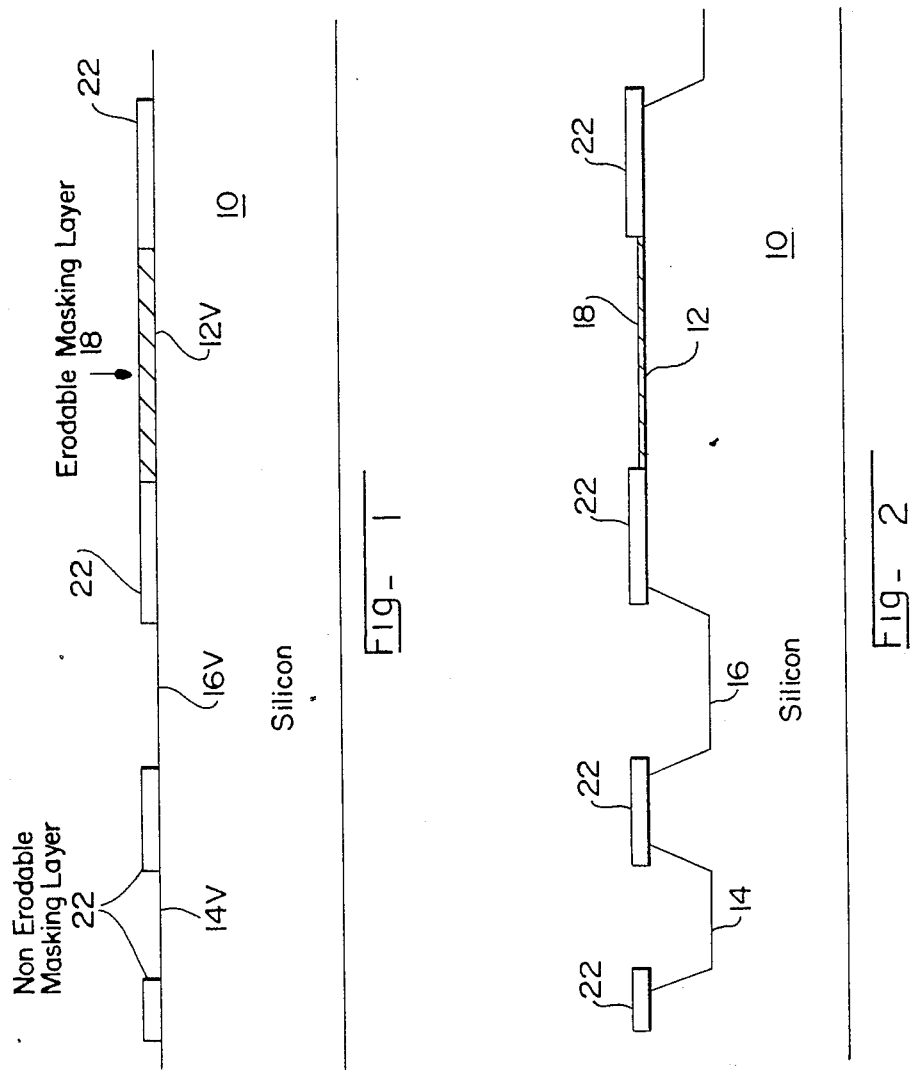

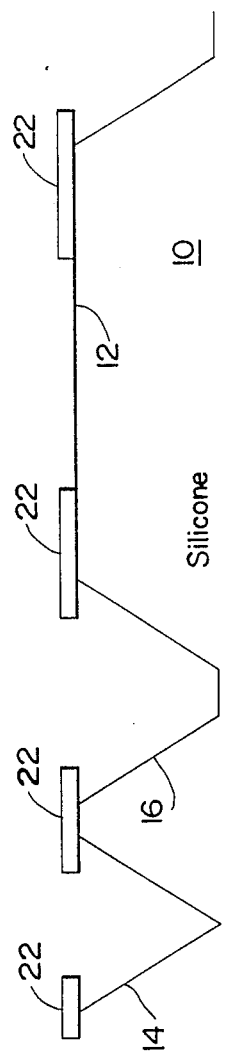
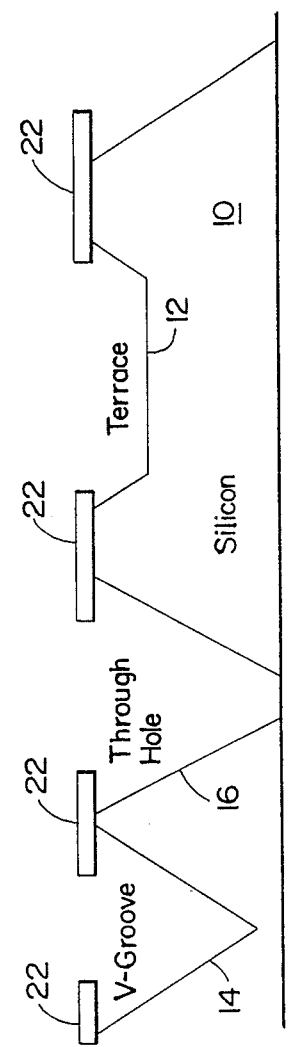

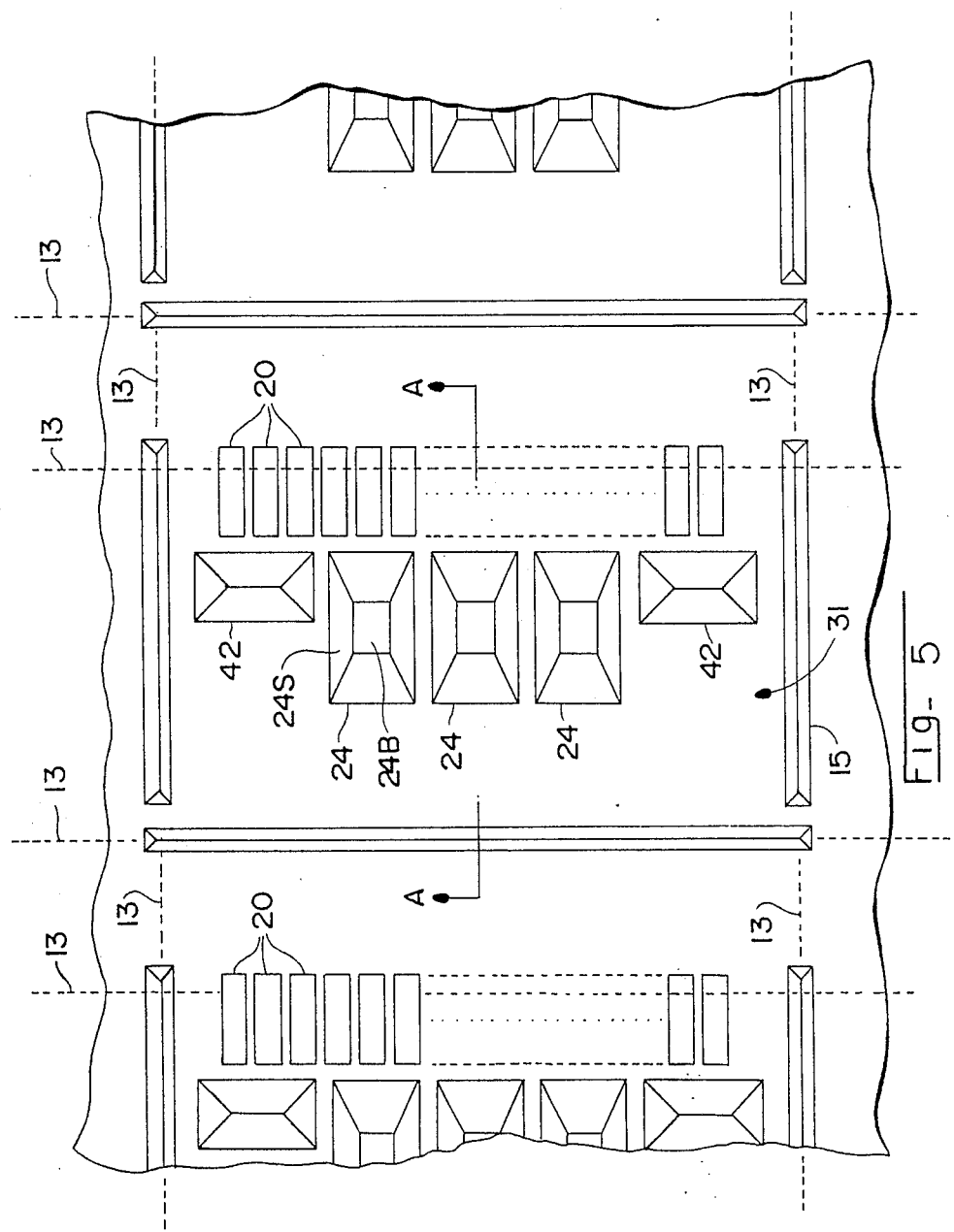

METHOD OF USING ERODABLE MASKS TO PRODUCE PARTIALLY ETCHED STRUCTURES IN ODE WAFER STRUCTURES

BACKGROUND AND SUMMARY OF THE INVENTION

1. Field of the Invention

The invention relates to a method for processing a thermal ink jet silicon wafer printhead by partially etching into one portion of the wafer while completely etching through another portion of the wafer. More specifically, the invention relates to a method for anisotropically etching partially into one portion of a silicon wafer using an erodable mask material. The depth of the partial etching is controlled either by the rate of erosion of the mask material or the thickness of the mask material, so that the desired partial etch depth is obtained upon termination of the etchings in the remaining portions of the wafer.

2. Description of Related Art

Thermal ink jet printing is a type of drop-on-demand ink jet system wherein an ink jet printhead expels ink droplets on demand by the selective application of an electrical pulse to a thermal energy generator, usually a resistive heater, located in capillary-filled, parallel ink channels a predetermined distance upstream from the channel orifices or nozzles. The channel ends opposite the nozzles are in communication with a small ink reservoir to which a larger external ink supply is connected. The printhead normally includes a heater plate on which the heaters are located, and a channel plate in which channels are formed to serve as ink passageways for conveying ink from the ink supply to the resistors for expulsion at the nozzles.

Thermal ink jet printheads utilize the properties of Orientation Dependent Etching in the formation of channels in the channel plate. The wafer, which is preferably silicon, has its major surfaces lying substantially in the "100" plane and internal "111" planes at an angle for silicon of 54.7° to the 100 planes. Openings are formed in the silicon wafer using an anisotropic etchant which works much more normally to the 100 plane than it does laterally or parallel to the 100 plane. Hence, the etchant works less in the 111 planes to thereby leave inverted pyramidal openings in the wafer. The location of the opening is determined by applying an etch mask to the surface of the wafer to be etched and then opening a via in the mask material through which the etchant can attack the 100 planes. The depth of the opening if etched to termination (i.e., when all exposed 100 planes are removed) is generally a function of the size of the via and the thickness of the wafer. For example, if the via opening, V, in the etch mask M is designed to produce a through-hole H just reaching the opposite side CS of a 20 mil thick silicon wafer (see FIG. 6B), it will actually produce a 1.4 mil wide opening 0 on a 19 mil thick wafer W2 (FIG. 6A) and will not produce any opening at all on a 21 mil thick wafer W3 (see FIG. 6C). Decreasing the size of the via opening V (FIG. 6D) will also affect the depth of the cavity since the size of the via determines the area of 100 planes subject to attack. In particular, the depth is defined by the following formula: the depth of the opening equals one-half the product of the smallest via opening dimension and the tangent of 54.7° (for a silicon wafer).

With this technology, it is possible to etch structural patterns in the silicon wafer with close dimensional tolerances. The patterns are formed by through-hole technique (e.g., FIGS. 6A and 6B which create a through-hole in the wafer), V-groove termination (e.g., FIGS. 6C and 6D which create a V-groove recess of a predetermined depth), or a combination of both. However, it is sometimes useful to produce large etch areas of varying depth that will terminate within the wafer at the same time, and the foregoing technology cannot readily satisfy this need. For example, if a 20 mil silicon wafer is patterned to include a through-opening and a V-shaped groove channel about 46-47 microns deep and about 65 microns wide, it will take about four hours for the etchant (e.g., 30% KOH at 95° C.) to form the through-hole, but substantially less time to form the V-groove. For a single etching step operation, the wafer remains in the etchant until the through opening is completed, thus subjecting the V-groove to continued etchant exposure even after the V-groove etch has terminated. The longer the wafer remains in the etchant, the greater the possibility that the etchant will find a crystal defect in the V-groove which it could attack, thus affecting the desired 65 micron channel width.

An object of the invention is to obviate the foregoing disadvantages by providing a method for etching openings of varying depths in a wafer in a single etch step, so that the openings in the wafer will attain a desired etch depth at about the same time, thereby reducing the amount of time that a shallower opening is exposed to the etchant.

This and other objects and advantages are obtained by the inventive method which anisotropically etches partially into one portion of a wafer using an erodable mask material. The depth of the partial etching is controlled either by the rate of erosion of the mask material, and/or the thickness of the masking material, so that the desired partial etch depth is obtained upon termination of etchings in the remaining portions of the wafer.

BRIEF DESCRIPTION OF THE DRAWINGS

The invention will be described with reference to the following drawings in which like reference numerals denote like elements and wherein:

FIGS. 1-4 are schematic side views of a silicon wafer at different stages of the etching process in accordance with the invention;

FIG. 5 is an enlarged schematic view of a channel plate prior to completion of the etching process.

DETAILED DESCRIPTION OF THE PREFERRED EMBODIMENT

Figure 6A:
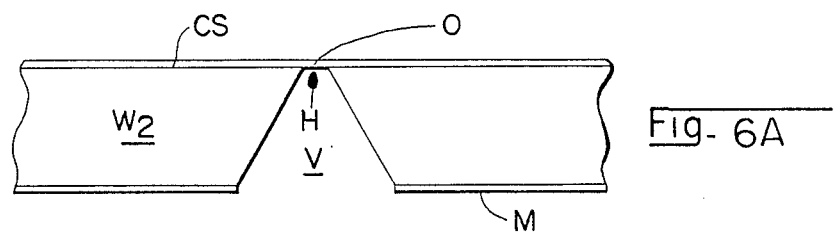
FIGS. 6A-6D are schematic side views of an etched silicon wafer.
Figure 6B:
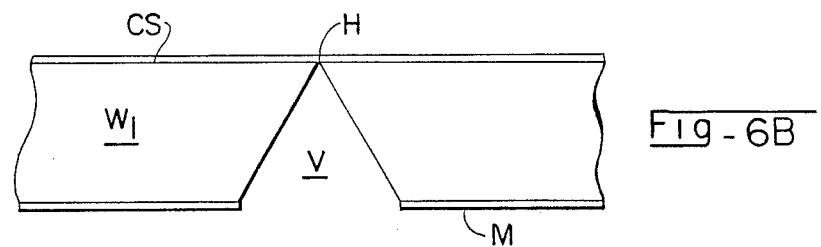
Figure 6C:
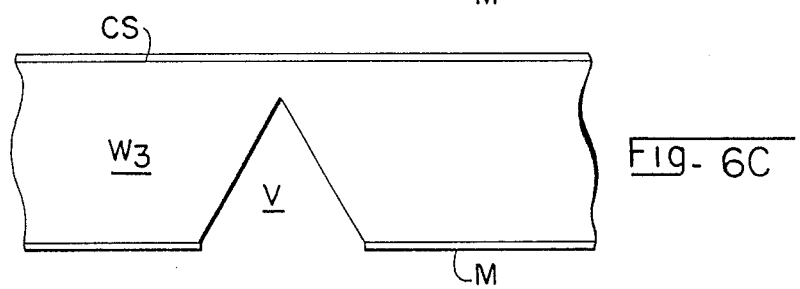
Figure 6D:
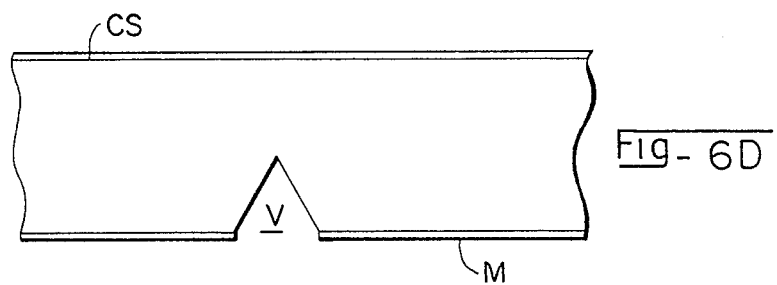

The invention will be described with reference to a silicon wafer, but the invention is applicable to any type of wafer or substrate capable of orientation dependent etching. The invention will also be described with reference to formation of a terrace in a wafer (i.e., a wafer opening having sloping side walls), but the invention is applicable to any etched opening including V-grooves or through-holes. Further, the invention will be described in connection with the fabrication of a printhead as disclosed in U.S. patent application Ser. No. 07/305,041 filed Feb. 2, 1989, or U.S. Pat. No. RE 32,572, the disclosures of which are herein incorporated by reference, but the invention is applicable to any type of printhead employing a wafer with openings of varying depths.

The invention will be described with reference to FIGS. 1–4 which illustrate the process for formation of a terrace 12, V-groove 14 and through-hole 16 in a silicon wafer 10. In FIG. 1, a first erodable masking layer 18 has been applied at the desired location for the terrace 12, preferably by applying the first masking layer 18 over the upper surface of the wafer 10 and then patterning the erodable mask material to leave the first erodable masking layer 18 at the desired location(s). A second non-erodable masking layer 22 is then applied over the wafer 10 to cover the wafer 10 and the first erodable masking layer 18. The second non-erodable masking material is then patterned to form the desired vias, at least one of which exposes the first masking layer 18. In FIG. 1, the second non-erodable masking layer 22 is patterned to include three vias: a first via 12V for the terrace 12, a second via 14V for the V-groove 14, and a third via 16V for the through-hole 16. It is noted that the application of the second non-erodable masking layer 22 may entail some overlap over the edge of the first erodable masking layer 18. Further, it is noted that the erodable masking layer 18 may be applied after application of the non-erodable masking layer 22.

The wafer 10 is then subjected to an etchant. Preferably the etching is a single step process wherein the wafer is subjected to the etchant for a predetermined period of time sufficient to form the deepest opening, (for example the through-hole 16). To etch a through-hole in a 20 mil thick wafer, the predetermined period of time is about 4 hours for 30% KOH at 95° C. The predetermined period of time will vary depending on the type of etchant, the etchant temperature and the etchant concentration.

FIG. 2 illustrates the etching process at some period of time less than the predetermined period of time, for example after about 1–2 hours of a 4 hour process (depending on the type, temperature and concentration of the etchant). The wafer has been etched at the second and third vias 14V, 16V for the V-groove 14 and through-hole 16, respectively, but has not yet attacked the wafer through the first via 12V since the etchant has not yet etched through the erodable first masking layer 18. However, FIG. 2 illustrates that the thickness of the erodable first masking layer 18 has decreased due to the erosion of the first masking layer 18.

FIG. 3 illustrates the process at a later time, for example after about 3 hours of the 4 hour process (depending on the type, temperature and concentration of the etchant). In FIG. 3, the etching of the V-groove 14 has terminated, but the etching of the through-hole 16 continues. Even though etching of the V-groove 14 has terminated (to a depth in accordance with the formula discussed above), the V-groove 14 will be subjected to continued etchant exposure for the remainder of the etching process (i.e., for about 1 hour depending on the type, temperature and concentration of the etchant). Such continued exposure increases the risk that the etchant will uncover a crystal defect in the V-groove which it could attack, thus affecting the desired width of the V-groove. FIG. 3 also illustrates that the etchant has eroded the first masking layer 18 and can now attack the wafer to form the terrace 12. However, the commencement of the wafer etching to form the terrace has been delayed for about three hours due to the presence of the erodable masking layer 18 Thus the terrace 12 will not be exposed to excess etchant exposure since etching of the terrace 12 will continue for only so long as necessary to complete etching of the through-hole 16.

FIG. 4 illustrates the wafer at the completion of the etchant process, e.g., after the 4 hour predetermined period of time, when the wafer is removed from etchant exposure. In FIG. 4, the etchant has completely etched through the wafer to form the through-hole 16. However, the depth and width of the terrace 12 are controlled since it was exposed to etchant for less time, thus reducing the risk that crystal defects in the terrace will be uncovered by the etchant. It is noted that etching of the terrace 12 would have continued if the wafer remained exposed to the etchant. Thus, the depth of the terrace can be controlled by controlling the time of exposure to the etchant. The invention, however, permits the desired depth of the terrace to be obtained at the time of termination of through-hole etching, thus permitting the etching of the terrace 12, V-groove 14 and through-hole 16 in a single etching operation without necessarily exposing the terrace to excess etchant exposure while awaiting completion of through-hole etching.

The concepts of FIGS. 1–4 are applicable to the V-groove 14 as well. That is, the first masking layer 18 could be applied over the via 14V so that the etchant must first erode the first masking layer 18 before etching the V-groove 14. The timing of the termination of V-groove etching can then be controlled to approximately coincide with the termination of the through-hole etching so that the V-groove 14 would not be exposed to etchant during the time period necessary for completion of the through-hole etching.

The invention thus provides a method of producing large areas on a silicon wafer that are partially etched into the wafer while at the same time other portions of the wafer are completely etched through. This is accomplished by using a mask, in the areas to be partially etched through, of a material that slowly erodes away in the silicon etchant. The depth of the terrace structure can be controlled by the size of the via (by the formula discussed above) in conjunction with control of either the rate the mask erodes or the thickness of the masking material or a combination of both. Silicon Dioxide is a prime example of an erodable mask, having an etch rate in 30% KOH at 95° C. of approximately 1 $\mu$m/hr for thermal oxide and 8.4 $\mu$m/hr for LOTOX, 4% PSG. For very deep terraces the LOTOX masking material would be appropriate while the thermal oxide would be appropriate for shallower terraces. For ODE structures making use of highly doped layers as an etch stop where EDP is the etchant, a nitride masking layer could be used since nitride etches at a rate of 60 $\mu$m/hr and very thin layers of nitride are known to be a very effective etch resistant layer(s).

The invention is applicable to a thermal ink jet printhead having an etched channel plate 31 (schematically illustrated in FIG. 5 as the area within dice lines 13, as disclosed in U.S. patent application Ser. No. 07/305,041 filed Feb 3, 1989, the disclosure of which is herein incorporated by reference). The channel plate 31 includes, among other things, a plurality of through etched feed holes 24, two shallow V-groove reservoirs 42 adjacent the end feed holes 24, and a plurality of ink channel recesses 20. One end of the channel recesses 20 is diced along dice line 13 to form nozzles, and the opposite end communicates with the feed holes 24 and V-groove reservoirs 42. FIG. 5 illustrates the channel plate 31 prior to completion of the etching for the through holes 24, which include 111 plane sidewalls 24S and a 100 plane floor or bottom 24B.

The optimum channel recess size for the channel recesses 20 is normally about 46–47 microns deep and 65 microns across. In a single etch operation, the channel recesses 20 would terminate well prior to the time for termination of etching for the feed holes 24. Accordingly, the channel recesses 20 would be exposed to etchant while waiting for the termination of the feed hole etching, thus increasing the risk of the etchant uncovering a crystal defect in the recess 20 which the etchant could attack, thus resulting in a potential variation in recess width. To obviate this potential disadvantage, the first erodable masking layer 18 could be applied and patterned at the locations for the channel recesses 20, and the second non-erodable masking layer 22 could then be applied and patterned to expose the first erodable masking layer and the vias for the feed holes 24 and shallow recesses 42 in a manner similar to that described with reference to FIGS. 1–4. Depending on the erodable masking material, size of the via, and the time of etchant exposure, the depth of the channel recess can be controlled by controlling the rate of erosion of the erodable mask layer and/or the thickness of the erodable mask layer. Further, the time of termination of the etching for the channel recess 20 can be controlled by controlling the erosion rate and/or thickness of the erodable mask layer, so that the desired channel depth is obtained upon completion of the etching for the feed holes 24. FIG. 5 illustrates etching of the channel plate 31 at a point in time comparable to FIG. 3 wherein the etching of the V-grooves 42 is completed, etching of the feed holes 24 is continuing, and etching of the channel recesses 20 is just beginning since the etchant has removed the erodable masking layer.

The invention has been described with reference to the preferred embodiments thereof, which are intended to be illustrative, not limiting. Variations and changes may be made without departing from the spirit and scope of the invention as defined in the appended claims.

What is claimed is:

1. A method of fabricating an opening in a wafer comprising the steps of:
    applying an erodable first mask to a surface of the wafer;
    patterning the erodable first mask to define an erodable first mask layer at a desired location for the opening;
    applying a second mask layer over the erodable mask layer;
    patterning the second mask layer to expose the erodable first mask layer;
    anisotropically etching through the first erodable mask layer and into the wafer to form the opening to a desired depth.

2. The method of claim 1 further comprising the step of controlling the depth of the opening by controlling an erosion rate of the erodable mask layer.

3. The method of claim 1 further comprising the steps of controlling the depth of the opening by controlling the thickness of the erodable mask layer.

4. The method of claim 1 further comprising the step of controlling the depth of the opening by controlling the erosion rate of the erodable mask layer and the thickness of the erodable mask layer.

5. The method of claim 1, wherein the erodable mask layer is silicon dioxide.

6. The method of claim 1, wherein the erodable mask layer is a nitride masking layer.

7. A method of fabricating at least two openings of different depths in a wafer, the method comprising the steps of:
    applying an erodable first masking layer to a surface of the wafer;
    patterning the erodable first masking layer to form a first via at a desired location for a first opening;
    applying a second masking material over the surface of the wafer and the erodable first masking layer;
    patterning the second masking layer to expose the first via and form a second via at a desired location for a second opening, the second via exposing the first erodable masking layer;
    anisotropically etching the wafer and the erodable masking layer through the first and second vias for a predetermined period of time to form the first opening with a depth greater than a depth of the second opening.

8. The method of claim 7, wherein the etching of the second opening terminates at substantially the same time as the etching of the first cavity terminates.

9. The method of claim 8, wherein the etching of the first opening terminates when the predetermined period of time expires.

10. The method of claim 7 wherein the first opening is through hole.

11. The method of claim 7 further comprising the step of controlling the depth of the second opening by controlling an erosion rate of the erodable mask layer.

12. The method of claim 7 further comprising the steps of controlling the depth of the second opening by controlling the thickness of the erodable mask layer.

13. The method of claim 7 further comprising the step of controlling the depth of the second opening by controlling the erosion rate of the erodable mask layer and the thickness of the erodable mask layer.

14. The method of claim 7, wherein the erodable mask layer is silicon dioxide.

15. The method of claim 7, wherein the erodable mask layer is a nitride masking layer.

16. A method of fabricating at least two openings of different depths in a wafer, the method comprising the steps of:
    applying a non-erodable masking layer to a surface of the wafer;
    patterning the non-erodable masking layer to form first and second vias at desired locations for first and second cavities, respectively;
    applying an erodable masking layer to the surface of the wafer to cover the first and second openings;
    patterning the erodable masking layer to expose the wafer surface at the first via;
    anisotropically etching the wafer and the erodable masking layer through the first and second vias for a predetermined period of time to form the first opening with a depth greater than a depth of the second opening.

17. The method of claim 16, wherein the etching of the second opening terminates at substantially the same time as the etching of the first opening terminates.

18. The method of claim 17, wherein the etching of the first opening terminates when the predetermined period of time expires.

19. The method of claim 16 further comprising the step of controlling the depth of the second opening by controlling an erosion rate of the erodable mask layer.

20. The method of claim 16 further comprising the steps of controlling the depth of the second opening by controlling the thickness of the erodable mask layer.

* * * * *